United States Patent
Bruce et al.

(10) Patent No.: US 6,836,132 B1
(45) Date of Patent: Dec. 28, 2004

(54) HIGH RESOLUTION HEAT EXCHANGE

(75) Inventors: Michael R. Bruce, Austin, TX (US);
David H. Eppes, Austin, TX (US);
Rama R. Goruganthu, Austin, TX (US)

(73) Assignee: Advance Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/113,604

(22) Filed: Mar. 29, 2002

(51) Int. Cl.[7] .............................................. G01R 31/28
(52) U.S. Cl. ...................... 324/765; 324/760
(58) Field of Search ................................ 324/765, 751, 324/752, 760

(56) References Cited

U.S. PATENT DOCUMENTS

| | | | |
|---|---|---|---|
| 6,066,956 A | * | 5/2000 | Nikawa ........................ 324/752 |
| 6,078,183 A | | 6/2000 | Cole, Jr. |
| 6,429,669 B1 | * | 8/2002 | Ito et al. ...................... 324/753 |
| 6,545,500 B1 | * | 4/2003 | Field ............................ 324/770 |
| 6,549,022 B1 | * | 4/2003 | Cole et al. ................... 324/752 |
| 6,560,556 B1 | * | 5/2003 | Hopkins et al. ............. 702/121 |

* cited by examiner

*Primary Examiner*—Ernest Karlsen

(57) ABSTRACT

A semiconductor device is analyzed and manufactured using a heat-exchange probe. According to an example embodiment of the present invention, a heat-exchange probe is controlled to exchange heat to a portion of a semiconductor device using sub-micron resolution. In one implementation, sub-micron resolution is achieved using a navigational arrangement, such as microscope, adapted to direct light to within about one micron of a target circuit portion on a plane of the device. In another implementation, a physical heat probe tip (e.g., a metal probe having about a one micron diameter probe tip) is navigated to a selected portion of the device using sub-micron navigational resolution. In each of these implementations, as well as others, the heat exchange is preponderantly confined to within about a one micron radius of a target portion of circuitry on lateral plane of the device. With this approach, heat exchange can be controlled to selectively stimulate circuitry within the device, which is particularly useful in high-density circuit implementations.

20 Claims, 3 Drawing Sheets

HIGH RESOLUTION HEAT EXCHANGE

FIELD OF THE INVENTION

The present invention relates generally to semiconductor devices and their fabrication and, more particularly, to semiconductor devices and their manufacture involving techniques for analyzing and debugging circuitry within an integrated circuit.

BACKGROUND OF THE INVENTION

The semiconductor industry has recently experienced technological advances that have permitted dramatic increases in integrated circuit density and complexity, and equally dramatic decreases in power consumption and package sizes. Present semiconductor technology now permits single-die microprocessors with many millions of transistors, operating at speeds of hundreds of millions of instructions per second to be packaged in relatively small, air-cooled semiconductor device packages.

A by-product of such high-density and high functionality is an increased demand for products employing these microprocessors and devices for use in numerous applications. As the use of these devices has become more prevalent, the demand for faster operation and better reliability has increased. Such devices often require manufacturing processes that are highly complex and expensive.

As the manufacturing processes for semiconductor devices and integrated circuits increase in difficulty, methods for testing and debugging these devices become increasingly important. Not only is it important to ensure that an individual die is functional, it is also important to ensure that batches of dice perform consistently. In addition, the ability to detect a defective manufacturing process early is helpful for reducing the number of defective devices manufactured.

Many semiconductor device characteristics are temperature-related. For example, defective circuitry can recover or fail at high temperatures. Circuit sites exhibiting temperature sensitive defects, such as charge trapping and ionic contamination, can recover when heated. Other sites exhibiting temperature sensitive defects, such as resistive interconnects, can fail when heated. These temperature-related characteristics can cause operational instability, and can ultimately result in circuit failure.

In many applications, the area available for accessing semiconductor device circuitry also limits the ability to test the circuitry, as well as limits the quality of data that can be collected when analyzing temperature-related characteristics. This access area becomes increasing smaller as semiconductor devices are scaled down in size with increasing amounts of circuitry therein, and as device feature size approaches the sub-micron regime. For example, active circuit regions (e.g., source/drain regions) are being formed having feature sizes that are less than one micron in width. However, previously-available approaches to circuit access (e.g., for stimulating circuitry) have been limited in resolution, which typically has been limited to one micron. In addition, accessing circuitry can sometimes alter or destroy the circuitry being tested. These and other considerations have presented challenges to the design, manufacture and analysis of semiconductor devices.

SUMMARY OF THE INVENTION

Addressing the above and other concerns, the present invention is directed to the analysis of an integrated circuit die involving heat exchange. The analysis can be effected via the back side or the front side of the die. The present invention is exemplified in a number of implementations and applications, some of which are summarized below.

According to an example embodiment of the present invention, a semiconductor device is probed using sub-micron resolution to apply and/or withdraw heat from a selected circuit in the device. A response (or lack thereof) of device to the heating and/or cooling is then detected and used to analyze the device. With this approach, a surface area of circuitry that is less than one $micron^2$ can be individually heated and/or cooled and a response of the device thereto can be used for the analysis. Defects and other circuit conditions can then be analyzed, addressing challenges to the manufacture and analysis of semiconductor devices, such as those discussed hereinabove.

According to another example embodiment of the present invention, a system is arranged for probing a semiconductor device using sub-micron resolution. The system includes a probe configured and arranged to exchange heat with the die and a navigational arrangement configured and arranged to direct the probe within one micron of a selected portion of the die. With this approach, the heat exchange is predominantly confined to within about a one micron radius on a lateral plane of the semiconductor device (e.g., with the lateral plane being perpendicular to the direction of the heat exchange).

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
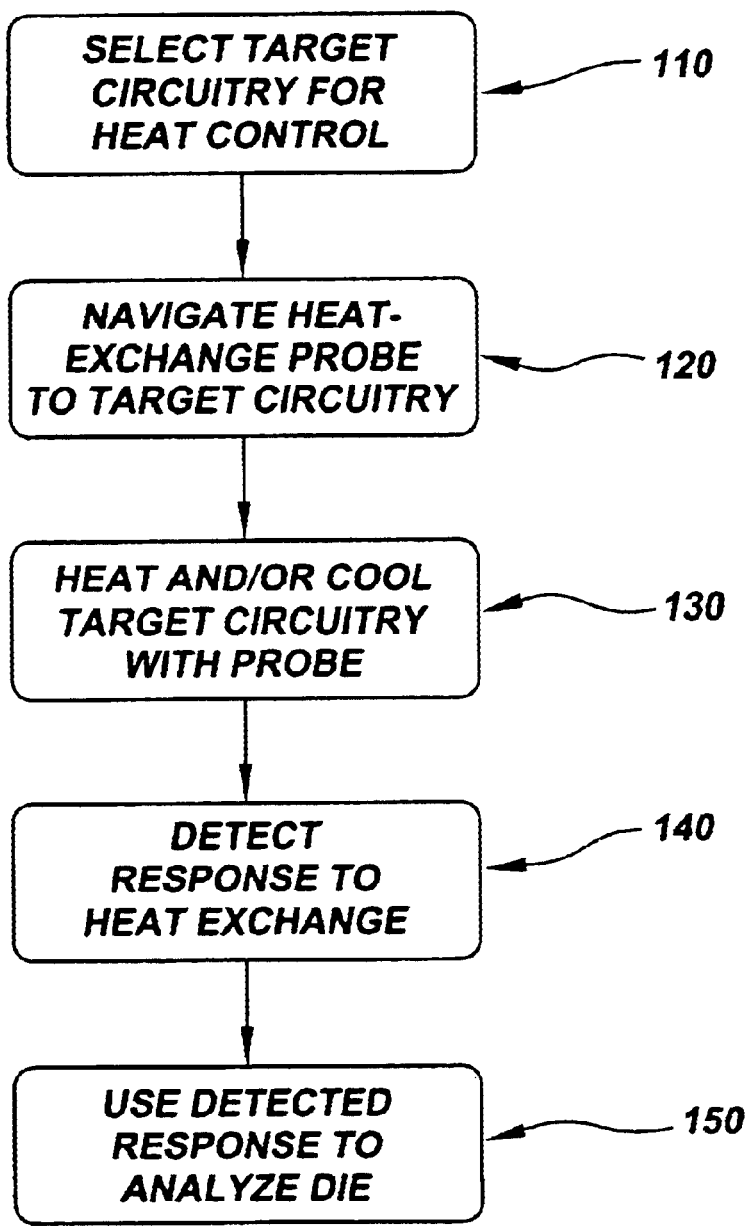
FIG. 1 is a flow diagram for controlling heat in a semiconductor die, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and the invention has been found to be particularly suited for the manufacture and analysis of integrated circuit dies having sub-micron feature sizes. While the present invention is not necessarily limited to such devices, various aspects of the invention may be appreciated through a discussion of various examples using this context.

According to an example embodiment of the present invention, a semiconductor die is analyzed using a probe capable of sub-micron resolution to heat and/or cool circuitry in the die. Using sub-micron resolution, the probe is navigated to and used for directing heat to, or removing heat from, a selected portion of the circuitry, and the heat exchange is preponderantly (e.g., at least 80%) confined to about a one micron area. A response of the die to the heating and/or cooling is detected and used to analyze a condition of circuitry in the die. For example, certain circuit defects can recover or fail when heated or when cooled. By operating the die in a failure condition, observing a recovery of the die in response to heat applied to a particular circuit is an indication that the circuit being heated is responsible for the failure. Similarly, by operating the die near a failure condition, observing a failure of the die in response to heat applied to a particularly circuit is an indication that the particular circuit being heated is responsible for the failure. The sub-micron resolution allows the location of the defective circuitry to be accurately identified, which in turn aids in the ability to design and/or analyze the die. Once the defective circuitry is identified, modifications can be made in the design and additional dies having the modified design can then be manufactured.

The probe may include one or more of a variety of devices capable of directing or extracting heat within one micron of a desired target. In one implementation, the probe includes a heating element tip that can be navigated to within one micron of a desired target. The tip may include, for example, a thermocouple, a conductive metal that can be cooled, a micro-peltier device, any or all of which may have physical dimensions at the tip that are less than one micron. In another implementation, the probe includes a far infrared light device capable of directing far infrared light having a beam width of less than about one micron.

FIG. 1 is a flow diagram for analyzing a semiconductor die, according to a more particular example embodiment of the present invention. At block 110, target circuitry is selected for heat exchange for analyzing the die. The target circuitry may, for example, include circuitry that is susceptible to a particular defective condition or is susceptible to producing a failure elsewhere in the die. A heat-exchange probe is navigated using sub-micron resolution for exchanging heat with the target circuitry at block 120, and the target circuitry is heated and/or cooled with the probe at block 130.

The heat exchange between the target circuitry and the probe causes a response in the die, and the response is detected at block 140. As discussed in the examples above, the response may include a direct response of the circuitry being heated and/or cooled, or an indirect response of other portions of the die to the circuitry being heated and/or cooled. For instance, the addition/withdrawal of heat to/from a particular circuit region may change a voltage state and/or a resistance state of the target circuitry. The state change is in turn detected either directly as a change in the target circuitry or indirectly as a change in a circuit path including the target circuitry or in a circuit path affected by the target circuitry (e.g., due to parasitic and/or capacitive effects).

The die is analyzed at block 150 using the response detected at block 140 and the analysis is used to identify one or more of a variety of circuit characteristics of the die. In various example implementations, thermal characteristics, interconnect characteristics (e.g., resistivity, open and short circuits), timing characteristics and/or stress characteristics are analyzed as a heat response of the die.

In a more particular implementation, the target circuitry is selected at block 110 by first identifying a circuit region as containing the target circuitry using a relatively low-resolution detection scheme, such as described in U.S. Pat. No. 6,078,183. Once the circuit region is identified, the heat-exchange probe is scanned at block 120 over the target circuitry. The position of the scan when the response is detected at block 140 is noted and used at block 150 to identify the location of circuitry that causes the response. This approach is particularly useful where the location of the target circuitry is not known, such as when identifying the location of a defect in a die.

Figure 2:
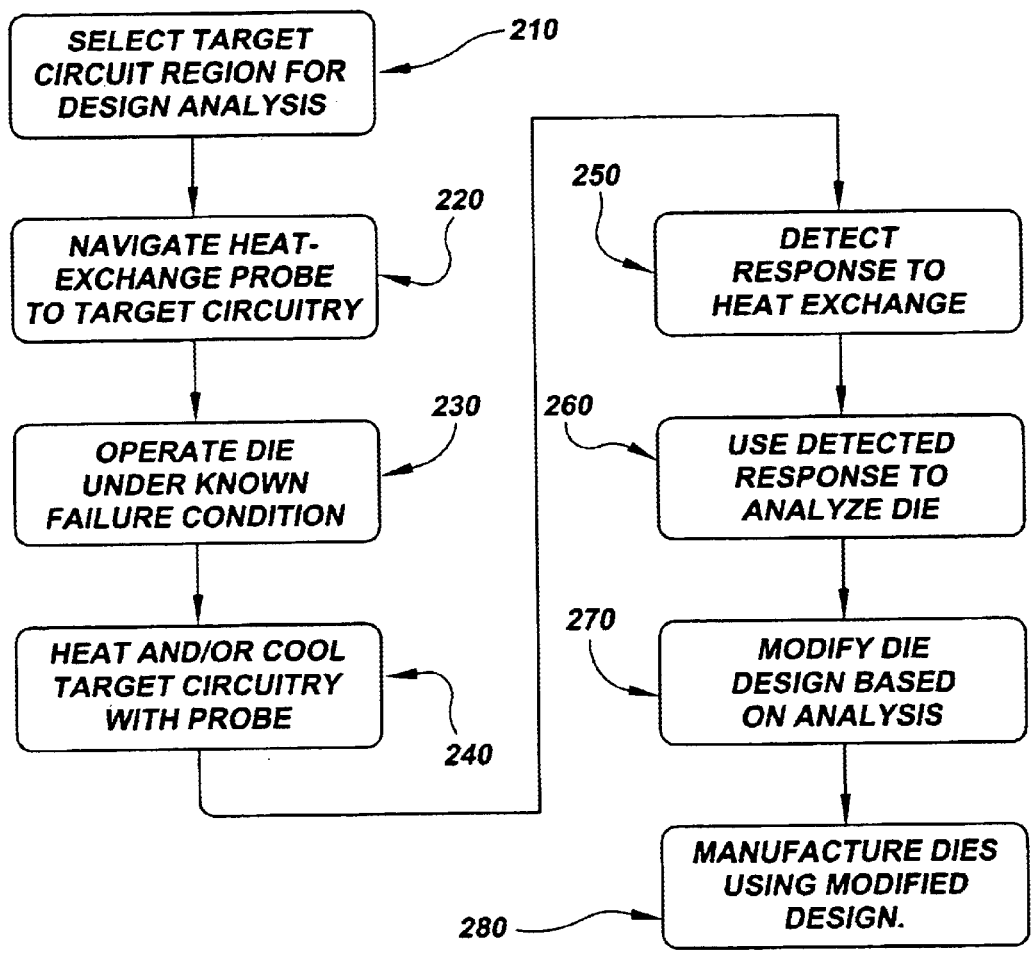
FIG. 2 is another flow diagram for controlling heat in a semiconductor die, according to another example embodiment of the present invention.

FIG. 2 is a flow diagram for manufacturing a semiconductor die, according to another example embodiment of the present invention. At block 210, a target circuit region in a semiconductor die is selected for analysis. A heat-exchange probe is navigated for exchanging heat with the target circuitry at block 220. The die is operated under a condition known to cause a failure at block 230, such as by operating the die at a speed at which the die has demonstrated a tendency to fail.

The target circuitry is heated and/or cooled with the heat-exchange probe at block 240. In one implementation, the die is heated to cause the die to recover from a failure condition caused by the operation at block 230. In another implementation, the die is cooled to recover from a failure condition caused by the operation at block 230. In still another implementation, the die is maintained near a threshold temperature by both heating and cooling the die at block 240, the threshold temperature being a temperature at which the die is susceptible to failure.

A response of the die to the heat exchange is detected at block 250, and the detected response is used to analyze the die at block 260. Circuitry in the die that is susceptible to failure, potentially including the target circuitry, is identified via the analysis. Based on the analysis, the design of the die is modified at block 270. The design modification may, for example, include a modification of the manufacturing process used, a modification of physical orientation of the die and/or a modification of the type of material used in the die. The modified design is then used in the production of semiconductor dies at block 280. Alternatively, the die manufactured at block 280 is re-analyzed, beginning at block 220 using the same target circuitry, and again analyzed and modified in response thereto until an acceptable die is attained.

Figure 3:
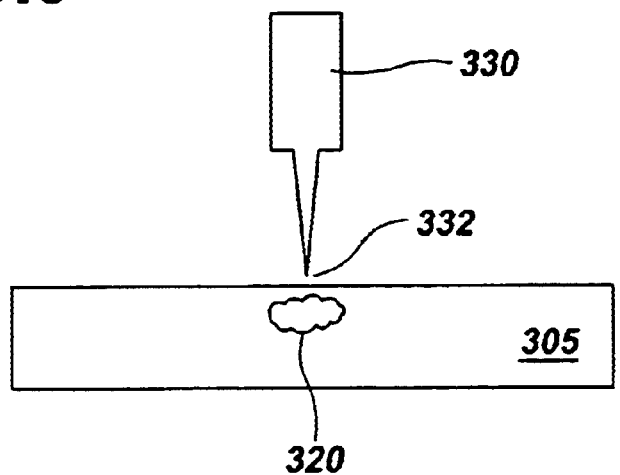
FIG. 3 shows a semiconductor die being analyzed, according to another example embodiment of the present invention.

FIG. 3 shows a semiconductor die 305 being analyzed, according to another example embodiment of the present invention. A probe 330 having a fine probe tip 332 is arranged to be navigated over circuitry 320 in the die 305. The tip 332 has a diameter that is less than about one micron at a point near the die, and is navigated to within about one micron of a target portion of the circuitry 320. Heat is applied to the target portion of the circuitry 320 via the probe tip 332, and a response of the die 305 to the heat is detected.

Figure 4:
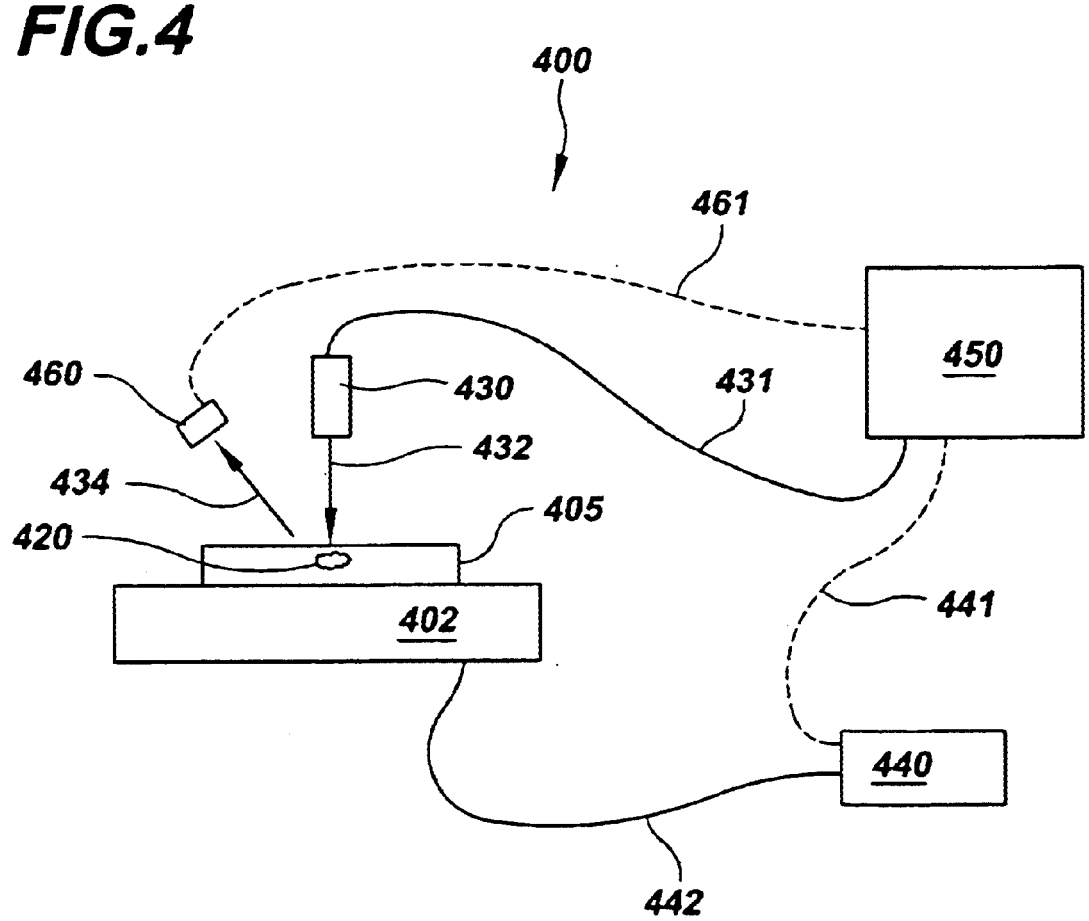
FIG. 4 is a system for analyzing an integrated circuit die, according to another example embodiment of the present invention.

FIG. 4 shows a system 400 for analyzing a variety of different types of semiconductor devices, according to another example embodiment of the present invention. The system includes a stage 402 that holds and electrically couples to a semiconductor device, shown holding an integrated circuit die 405. A signal generator 440 is electrically coupled to the die 405 via the stage 402 and communications link 442, and is adapted to apply operating signals (e.g., vectors) to the die 405. A navigable laser probe arrangement 430 is arranged over target circuitry 420 within the die 405 for directing far infrared laser light 432 to the target circuitry 420. The navigation of the laser arrangement 430 is controlled at controller 450 via communications link 431 and using sub-micron resolution, such that the far infrared light 432 is applied to within about one micron of selected target circuitry in the die 405.

A response of the die 405 to the far infrared light 432 is detected and used to analyze the die 405. The response may include a direct response of the target circuitry 420 and/or an indirect response of circuitry in the die affected by the heat generation at the target circuitry 420. In one implementation, an optical response 434 from the die 405 is detected using an optical detector 460. The optical response may include, for example, photons emitted as a result of heat generation and/or current flow in the die. In another implementation, an electrical response of the die is detected at the signal generator 440 via signal coupler 442 and the stage 402.

Both the optical detector 460 and the signal generator 440 are optionally coupled to the controller 450 for communication of data and/or for exchanging control signals therebetween using communications links 461 and 441, respectively. In one implementation, the controller 450 sends control signals to the laser probe arrangement 430 and causes far infrared laser light to scan across the die 405. A response of the die to the far infrared laser light is detected while monitoring a position signal of the laser probe arrangement, and the position signal is used to identify a circuit portion of the die 405 being stimulated at the time that the response was detected. This approach is particularly useful for identifying the location of circuitry responsible for causing a particular response of the die.

In another implementation, the laser probe arrangement 430 includes an NSOM having a cantilevered fiber optic probe that contacts the die 405. Light 432 from a far infrared laser is directed through the fiber optic probe during imaging and emits from the tip of the probe in contact with the sample. The laser probe arrangement 430 may be implemented using a variety of commercially-available products, such as those available from Carl Zeiss, Inc. of Thornwood, N.Y. and from Nanonics Imaging, Ltd. of Jerusalem, Israel. In addition, for general information on probe applications, and for specific examples of a probing technique to which the present invention is applicable, reference may be made to "Quantitative Thermal Probing of Devices at Sub-100 nm Resolution" by L. Shi et al., IRPS p.394 (2000), which is fully incorporated herein by reference. The light 432 heats the die 405, and a response thereto is detected and used to analyze the die. In one implementation, the laser device 430 and the optical detector 460 are part of a single NSOM.

In still another implementation, the laser probe arrangement 430 in the system 400 is replaced with the physical probe arrangement shown in FIG. 3. In this implementation, rather than the laser probe arrangement 430 directing heat via far infrared laser light 432, the physical probe 330 directs heat via the probe tip 332. The controller 450 is similarly coupled via communications link 431 to the probe 330 for navigating the probe tip 332 to within one micron of target circuitry 420 in the die 405.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: incorporating the invention to applications including cryogenic applications, molecular processing applications, nanotechnology applications and manufacturing applications including thermal printing; and interchanging various probe elements and techniques while maintaining sub-micron resolution. Such modifications and changes do not necessarily depart from the true spirit and scope of the present invention, which is set forth in the following claims.

What is claimed is:

1. A method for analyzing a semiconductor device, the method comprising:

applying a heat-exchange probe to the semiconductor device and preponderantly confining heat exchange between the heat-exchange probe and the semiconductor device to within about one micron of a selected position of the device along a lateral plane in the semiconductor device; and detecting a response of the semiconductor device to the heat exchange and analyzing the semiconductor device therefrom.

2. The method of claim 1, further comprising:

modifying the semiconductor device in response to analyzing the semiconductor device.

3. The method of claim 1, wherein applying a heat-exchange probe includes directing heat within a portion of the die having a surface area less than 1 micron$^2$, the surface area being along a lateral plane that is about perpendicular to the direction of the heat exchange.

4. The method of claim 1, wherein applying a heat-exchange probe includes positioning the heat-exchange probe within one micron of a selected position.

5. The method of claim 1, wherein applying a heat-exchange probe includes directing a probe having a peltier that heats the selected portion.

6. The method of claim 1, wherein applying a heat-exchange probe includes directing a probe having a resistive tip that heats the selected portion.

7. The method of claim 1, wherein applying a heat-exchange probe includes directing a probe having a laser arranged to direct far infrared laser light to heat the selected portion.

8. The method of claim 7, wherein directing a probe having a laser includes using an NSOM to direct the far infrared laser light.

9. The method of claim 1, wherein applying a heat-exchange probe includes cooling the selected portion.

10. The method of claim 1, wherein applying a heat-exchange probe includes directing a single configured and arranged to heat and cool the semiconductor device.

11. The method of claim 1, wherein detecting a response of the semiconductor device includes detecting at least one of: an electrical response, an optical response and a heat response.

12. The method of claim 1, wherein analyzing the semiconductor device includes using the detected response to detect a condition of circuitry in the device.

13. The method of claim 12, wherein using the detected response to detect a condition of circuitry in the device includes detecting a design defect, further comprising modifying the design to overcome the design defect.

14. The method of claim 12, wherein using the detected response to detect a condition of circuitry in the device includes detecting a defect in a manufacturing process for the semiconductor device, further comprising modifying the manufacturing process to overcome the design defect.

15. The method of claim 1, further comprising:

modifying a circuit design for the semiconductor device in response to analyzing the semiconductor device; and manufacturing a semiconductor device using the modified circuit design.

16. The method of claim 1, wherein applying a heat-exchange probe includes exchanging heat in pulses.

17. The method of claim 1, prior to applying a heat-exchange probe, further comprising:

identifying a circuit region of the die has having a defect therein; and wherein applying a heat-exchange probe includes directing a heat-exchange probe to a circuit portion within the identified defective circuit region.

18. The method of claim 1, prior to detecting a response of the semiconductor device, further comprising:

operating the die; and wherein analyzing the semiconductor device comprises analyzing a response of the die to the operation and to the heat control.

19. A method for analyzing a flip-chip type die having circuitry, including selected circuitry, in a circuit side that is opposite a back side comprising:

removing substrate from the back side of the die and exposing a surface therein;

applying a heat-exchange probe including directing a heat-exchange probe to a selected portion of the die via the exposed surface and preponderantly confining heat exchange between the heat-exchange probe and the die to within about one micron of a selected position of the die along a lateral plane in the die; and detecting a response of the die to the heat exchange and analyzing the die therefrom.

20. A semiconductor device manufactured in accordance with claim 11.

* * * * *

UNITED STATES PATENT AND TRADEMARK OFFICE
CERTIFICATE OF CORRECTION

PATENT NO. : 6,836,132 B1  
DATED : December 28, 2004  
INVENTOR(S) : Bruce et al.

It is certified that error appears in the above-identified patent and that said Letters Patent is hereby corrected as shown below:

<u>Title page,</u>  
Item [73], Assignee, "Advance Micro Devices, Inc." should read -- Advanced Micro Devices, Inc. --.

<u>Column 2,</u>  
Line 12, "(or lack thereof) of" should be -- (or lack thereof) of the --.

Signed and Sealed this

Third Day of May, 2005

JON W. DUDAS  
*Director of the United States Patent and Trademark Office*